United States Patent
Lim et al.

(10) Patent No.: US 11,047,905 B2
(45) Date of Patent: Jun. 29, 2021

(54) CONTACTOR WITH INTEGRATED MEMORY

(71) Applicant: Analog Devices International Unlimited Company, Limerick (IE)

(72) Inventors: Philip Lim, Agusan Del Sur (PH); Renand Magahis, Cavite (PH)

(73) Assignee: Analog Devices International Unlimited Company, Limerick (IE)

( * ) Notice: Subject to any disclaimer, the term of this patent is extended or adjusted under 35 U.S.C. 154(b) by 55 days.

(21) Appl. No.: 16/428,028

(22) Filed: May 31, 2019

(65) Prior Publication Data
US 2020/0379038 A1 Dec. 3, 2020

(51) Int. Cl.
*G01R 1/04* (2006.01)
*G01R 31/28* (2006.01)

(52) U.S. Cl.
CPC ....... *G01R 31/2889* (2013.01); *G01R 1/0408* (2013.01); *G01R 31/2891* (2013.01); *G01R 31/2896* (2013.01)

(58) Field of Classification Search
CPC ............ G01R 31/2889; G01R 31/2891; G01R 31/2896; G01R 1/0408; G01R 35/00
See application file for complete search history.

(56) References Cited

U.S. PATENT DOCUMENTS

| | | | | |
|---|---|---|---|---|
| 5,057,904 A | * | 10/1991 | Nagato | H05K 7/1084 257/693 |
| 5,384,692 A | * | 1/1995 | Jaff | H05K 7/1092 174/541 |
| 6,198,273 B1 | * | 3/2001 | Onishi | G01R 31/01 324/750.01 |
| 6,380,755 B1 | * | 4/2002 | Sato | G01R 31/31727 324/754.07 |
| 7,129,729 B2 | | 10/2006 | Ho et al. | |
| 9,106,229 B1 | * | 8/2015 | Hutton | H01L 25/105 |
| 9,335,343 B1 | | 5/2016 | Cortez | |
| 10,718,809 B1 | * | 7/2020 | Kim | G01R 1/0441 |
| 2003/0083839 A1 | * | 5/2003 | Boswell | G01R 31/002 702/117 |
| 2004/0030970 A1 | * | 2/2004 | Chen | G11C 29/48 714/718 |
| 2005/0206368 A1 | * | 9/2005 | Lopez | G01R 31/2863 324/750.07 |
| 2006/0002161 A1 | * | 1/2006 | Dangelo | G01R 31/2863 363/147 |
| 2006/0145718 A1 | * | 7/2006 | Lopez | G01R 31/2863 324/750.07 |

(Continued)

OTHER PUBLICATIONS

BiTS (Burn-in & Test Socket Workshop) 2009, Session 3, Archive 2009, *Adventures in Test & Burn-In Operations*, 42 pages.

*Primary Examiner* — Patrick Assouad
*Assistant Examiner* — Demetrius R Pretlow
(74) *Attorney, Agent, or Firm* — Patent Capital Group

(57) ABSTRACT

There is disclosed herein a contactor for production testing of an electrical product, where the contactor includes an integrated circuit with memory. The integrated circuit may store information related to the contactor in the memory that may be useful for the production testing. For example, the memory may store information that that can be used for identifying the contactor and/or determining whether maintenance of the contactor should be performed to achieve proper results of the production testing.

20 Claims, 12 Drawing Sheets

(56) References Cited

U.S. PATENT DOCUMENTS

| | | | | |
|---|---|---|---|---|
| 2008/0116922 | A1* | 5/2008 | Blaney | G01R 31/2891 |
| | | | | 324/750.03 |
| 2010/0201389 | A1* | 8/2010 | Lupashku | G01R 31/2863 |
| | | | | 324/750.03 |
| 2012/0229158 | A1* | 9/2012 | Seo | G01R 31/2894 |
| | | | | 324/756.02 |
| 2013/0206383 | A1* | 8/2013 | Maeda | H01L 21/67248 |
| | | | | 165/253 |
| 2014/0197409 | A1* | 7/2014 | Partsch | H01L 22/32 |
| | | | | 257/48 |
| 2015/0245525 | A1* | 8/2015 | Ping | G06F 13/409 |
| | | | | 361/679.32 |
| 2015/0355234 | A1* | 12/2015 | Palaniappa | G01R 1/0466 |
| | | | | 324/756.02 |
| 2015/0355279 | A1* | 12/2015 | Rogel-Favila | G01R 31/2893 |
| | | | | 324/750.25 |
| 2016/0349118 | A1* | 12/2016 | Olson | G01K 7/015 |
| 2017/0131347 | A1* | 5/2017 | Wang | G01R 31/2886 |
| 2017/0227599 | A1* | 8/2017 | Wu | G05D 23/1919 |
| 2017/0285101 | A1* | 10/2017 | Whetsei | G01R 31/318536 |
| 2018/0108642 | A1* | 4/2018 | Sauter | H01L 23/345 |
| 2018/0176006 | A1* | 6/2018 | McElheny | H01L 23/3675 |
| 2020/0150148 | A1* | 5/2020 | Chung | G01R 31/2851 |

\* cited by examiner

CONTACTOR WITH INTEGRATED MEMORY

FIELD OF THE DISCLOSURE

This disclosure relates in general to the field of electrical product testing, and more particularly, though not exclusively, to a contactor for interfacing the product with a test system to test the product.

BACKGROUND

Production testing of electrical products (such as integrated circuit packages and integrated circuit wafers) has become common practice to verify proper operation of the products after production. Production testing often includes engaging a product under test with a corresponding contactor within a test fixture, thereby communicatively coupling the product with the test fixture and a test system for testing.

Different products have different package types and lead counts, hence different contactor types and lead counts as well. In production testing where a large volume of products is being tested, there can be thousands of contactors being used. The large number of contactors can present issues identifying the particular contactor being utilized for testing, which can present issues with monitoring a number of uses of the contactor between replacement of replaceable components of the contactor, where the replaceable components should be replaced at certain use thresholds to ensure proper operation of the contactor.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

SUMMARY OF THE DISCLOSURE

Figure 1:
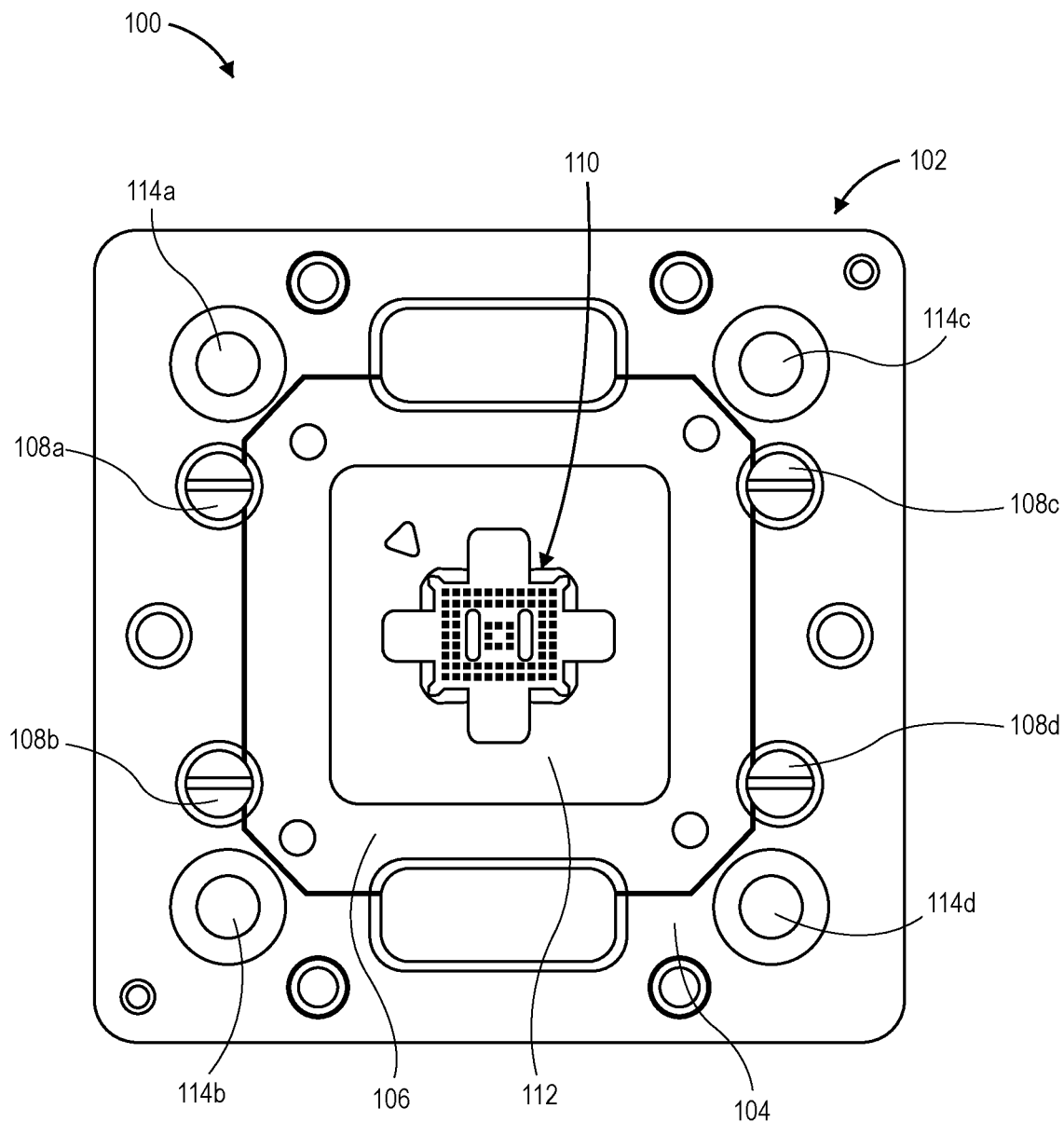
FIG. 1 illustrates a top view of an example contactor, according to various embodiments of the disclosure.

There is disclosed herein a contactor for production testing of an electrical product, where the contactor includes an integrated circuit with memory. The integrated circuit may store information related to the contactor in the memory that may be useful for the production testing. For example, the memory may store information that that can be used for identifying the contactor and/or determining whether maintenance of the contactor should be performed to achieve proper results of the production testing.

In certain embodiments, a contactor to receive a product and electrically couple the product to an interface board of a test arrangement is disclosed. The contactor includes a body to receive the product and couple to the interface board, the body having one or more pins to electrically couple the product to the interface board, and an integrated circuit (IC) located in the body, wherein the IC includes memory for storing information related to the contactor.

In certain embodiments, a test fixture for testing a product is disclosed. The test fixture includes a test arrangement that includes a contactor, wherein the contactor includes a body to receive the product and an IC located in the body, wherein the IC includes memory for storing information related to the contactor. The test fixture further includes a test system communicatively coupled to the IC, wherein the test system is to retrieve at a least a portion of the information related to the contactor from the memory.

In certain embodiments, a method of determining information related to a contactor utilized for testing of products by a test system is disclosed. The method includes retrieving, by the test system, an identifier of the contactor from a memory of an IC located within the contactor, and determining, by the test system, an identity of the contactor based on the identifier retrieved from the memory.

DETAILED DESCRIPTION

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different figures. This repetition is for the purpose of simplicity and clarity and does not in itself dictate a specific relationship between the various embodiments and/or configurations discussed. Different embodiments may have different advantages, and no particular advantage is necessarily required of any embodiment.

Production testing of products (such as integrated circuit (IC) packages and/or IC wafers) often involve connecting each of the products to a test system to run the product through a series of tests to verify proper operation of the product. In particular, the product may be communicatively coupled to an interface board of a test fixture coupled to the test system, where a contactor provides an interface between the interface board and the product. The contactor is located between the interface board and the product, and the contactor includes one or more pins that electrically couple contacts (such as pins, contact arrays, and/or probe contacts) of the product with contacts of the interface board to allow for transmission of electrical signal between the product and the interface board.

Use of the contactor can result in wear and tear of certain components of the contactor, where the components can be replaced at certain intervals to ensure proper operation of the contactor. For example, one or more pins of the contactor, one or more guide plates of the contactor, and one or more elastomer elements of the contactor are some examples of replaceable components that can be replaced at certain intervals to ensure proper operation of the contactor. It can be a challenge monitoring the number of uses and/or identifying a particular contactor, especially in instances where multiple contactors are utilized in production testing. Multiple contactors are often utilized in production testing as different products have different contact arrangements requiring different contactors. The contactors disclosed herein include an IC having memory (referred to as a "embedded IC" throughout this disclosure for clarity) for storing information related to the contactor. In embodiments, the embedded IC can store an identifier of the contactor, an identifier of the memory, a number of uses of the contactor, a number of uses of the contactor since a replaceable component has been replaced, and/or other information related to the contactor in the memory. The number of uses of the contactor can include a number of times a test is initiated using the contactor, a number of contact insertions for the contactor, or some combination thereof. The information stored in the memory can be accessed by another device (such as a test system) and utilized to determine if any of the replaceable components should be replaced and/or if the information should be taken into account when producing the results of the testing.

During production testing, determining the state of certain conditions related to the contactor can be beneficial. For example, determining the temperature of the contactor can be beneficial for determining whether temperature could be affecting the operation of the product during testing and/or to verify calibration of a temperature sensor of the product under test. Further, sensing presence of fasteners (such as screws) utilized for affixing the contactor to the interface board and/or determining a pressure between certain components of the test fixture (such as between the contactor and the product) can be utilized to determine whether the test fixture is properly set up for proper operation. The IC and/or the contactor can include characteristics and/or elements (such as a diode and/or conductive traces) that can be utilized for determining the state of the conditions.

FIG. 1 illustrates a top view of an example contactor 100, according to various embodiments of the disclosure. The top side of the contactor 100 can be configured to receive a product (such as an IC package and/or an IC wafer) against the top side of the contactor 100. In particular, one or more contacts (such as pins, contact arrays, and/or probe contacts) of the product can be positioned toward the top side of the contactor 100 and contact one or more elements located at a top side of the contactor 100 when the product is positioned against the contactor 100.

The contactor 100 can include a body 102 to receive the product. The body 102 may comprise a main body 104 and a fixed alignment frame 106. The fixed alignment frame 106 can be positioned against the main body 104 toward a top side of the contactor 100. In some embodiments, the main body 104 may include a recess in which the fixed alignment frame 106 is positioned. The fixed alignment frame 106 can be maintained in position by one or more fasteners, such as screw 108a, screw 108b, screw 108c, and screw 108d. In other embodiments, the main body 104 and the fixed alignment frame 106 can be combined into a single piece.

The contactor 100 includes an embedded IC (see the embedded IC 306 (FIG. 3)) having memory. In some embodiments, the embedded IC may comprise a memory device, such as an IC package of read-only memory (ROM), programmable read-only memory (PROM), erasable programmable read-only memory (EPROM), electrically erasable programmable read-only memory (EEPROM), random-access memory (RAM), static random-access memory (SRAM), and/or dynamic random-access memory (DRAM). In some embodiments, the embedded IC may include other functional blocks (such as a microcontroller unit or an impedance measurement unit) internal to the embedded IC. The embedded IC may store information related to the contactor 100 in the memory of the embedded IC. For example, the embedded IC may store an identifier of the contactor 100, an identifier of the memory, a number of uses of the contactor 100, a number of uses of the contactor 100 since a replaceable component (i.e., pins, guide plates, and/or elastomer elements) had been replaced, an impedance of pins of the contactor 100, or some combination thereof. The identifier of the contactor 100 may comprise a binary value that uniquely identifies the contactor 100 in some embodiments. For example, the identifier may comprise a 64-bit identifier in some embodiments. The identifier can be assigned to the contactor 100 during production of the contactor 100 or assigned by a system of an end user in different embodiments.

In some embodiments, the embedded IC can include a temperature sensor to determine the temperature of the contactor 100. For example, the embedded IC can include a diode that the embedded IC can utilize to determine the temperature of the contactor 100. The temperature sensor may be calibrated during production of the contactor 100 to ensure proper calibration of the temperature sensor.

The embedded IC can be located in the body 102 of the contactor 100. In particular, the embedded IC can be located on a surface of the body 102, within a recess of the body 102, or embedded within the body 102, where the embedded IC is surrounded by the body 102 with the exception of apertures for conductors coupled to the embedded IC when the embedded IC is embedded. In some embodiments, the embedded IC is located between the main body 104 and the fixed alignment frame 106. In some of these embodiments, the embedded IC is accessible by separating the fixed alignment frame 106 from the main body 104.

The contactor 100 further includes one or more pins 110 that can be mated with contacts of the product. For example, the contactor 100 includes 72 pins in the illustrated embodiment. The pins 110 may include an electrically-conductive material, where the electrically-conductive material is electrically coupled to the contacts of the product when positioned on the contactor 100. In some embodiments, the pins 110 may be recessed into the contactor 100 where the contacts of the product extend into the recesses to contact the pins 110 when the product is positioned on the contactor 100. In embodiments where the pins 110 are recessed, the recesses and the electrically-conductive material of the pins 110 may be located in the main body 104, where the fixed alignment frame 106 includes an opening that exposes the pins 110. Further, in some embodiments, the pins 110 may be supported by one or more elastomer elements. The pins 110 may extend through the body 102 from the top side of the body 102 to another side of the body, where the pins 110 can interface with contacts of an interface board (such as interface board 702 (FIG. 7)). In particular, the pins 110 may extend from the top side of the body 102 to a bottom side of the body 102, where the bottom side of the body 102 is opposite to the top side. In other embodiments, the pins 110 may be electrically coupled to electrically-conductive elements (such as traces, vias, and/or conductive layers) that in turn are electrically coupled to the contacts of the interface board.

The pins 110 (or at least the electrically-conductive material of the pins 110) may be worn through uses of the contactor 100. In particular, plunging (i.e., the act of placing contacts of the product in contact with the electrically-conductive material of pins 110 through force applied to cause the contacts of the product and the electrically-conductive material to be in contact) the products on the pins 110 and removing the products from the pins 110 can cause the pins 110 to wear. The wearing of the pins 110 can affect the performance of the contactor 100. To avoid failures in testing due to the wear of the pins 110, the pins 110 (or at least the electrically-conductive material of the pins 110) may be replaceable (i.e., a replaceable component) and may be intended to be replaced at a threshold number of uses of the contactor 100. For example, the pins 110 may be intended to be replaced every 100,000 or 200,000 uses of the contactor 100. The embedded IC may store a number of uses of the contactor 100 and/or a number of uses of the contactor 100 since the pins 110 had last been replaced, where the number of uses can be utilized to determine whether the pins 110 should be replaced.

The contactor 100 may further include a guide plate 112. The guide plate 112 may facilitate positioning of the product against the contactor 100, where the guide plate 112 can facilitate the alignment of the contacts of the product with the pins 110. In some embodiments, the guide plate 112 may be part of the fixed alignment frame 106. The guide plate 112 may be worn through uses of the contactor 100. In particular, the product may contact the guide plate 112 when being positioned and can cause wear of the guide plate 112. Deterioration of the guide plate 112 can negatively affect the ability to facilitate alignment of the product. To avoid the alignment being negatively affected, the guide plate 112 may be replaceable (i.e., a replaceable component) and may be intended to be replaced at a threshold number of uses of the contactor 100. The threshold number of uses for the guide plate 112 may be the same threshold number as threshold number of uses for the pins 110 or a different threshold number from the threshold number of uses for the pins 110. The embedded IC may store a number of uses of the contactor 100 and/or the number of uses of the contactor 100 since the guide plate 112 had last been replaced. The number of uses can be utilized to determine whether the guide plate 112 should be replaced.

The contactor 100 may further have one or more apertures located in the contactor 100 that can be utilized for coupling the contactor 100 to other elements or coupling other elements to the contactor 100. For example, the contactor 100 has first aperture 114*a*, second aperture 114*b*, third aperture 114*c*, and fourth aperture 114*d* (collectively referred to as "the apertures"). The apertures can be utilized to secure the contactor to an interface board (see the interface board 702 (FIG. 7)) and/or secure an actuator assembly (see the actuator assembly 708 (FIG. 7)). In particular, fasteners (such as screws) can extend through the apertures and secure contactor to the interface board and/or actuator assembly. In some embodiments, the side walls of the contactor 100 that abut the apertures can be threaded.

While an embodiment of the contactor 100 is shown and described in FIG. 1, it is be understood that other embodiments of contactors can include various differences from the embodiment shown. In particular, the shown embodiment has a particular arrangement of the pins 110. In other embodiments, the contactor can have a different arrangement of pins and/or can have more or less pins. Further, a size of the contactor 100 or components of the contactor 100 may differ, with all embodiments of the contactor including one or more pins and an embedded IC having memory. Further, the contactor may include one or more elastomer elements and/or other cushioning elements. The elastomer elements and/or other cushioning elements may be replaceable. In some embodiments, the embedded IC may store a number of uses since the elastomer elements and/or other cushioning elements had been replaced, and the number of uses may be utilized to determine when the elastomer elements and/or other cushioning elements should be replaced.

Figure 2:
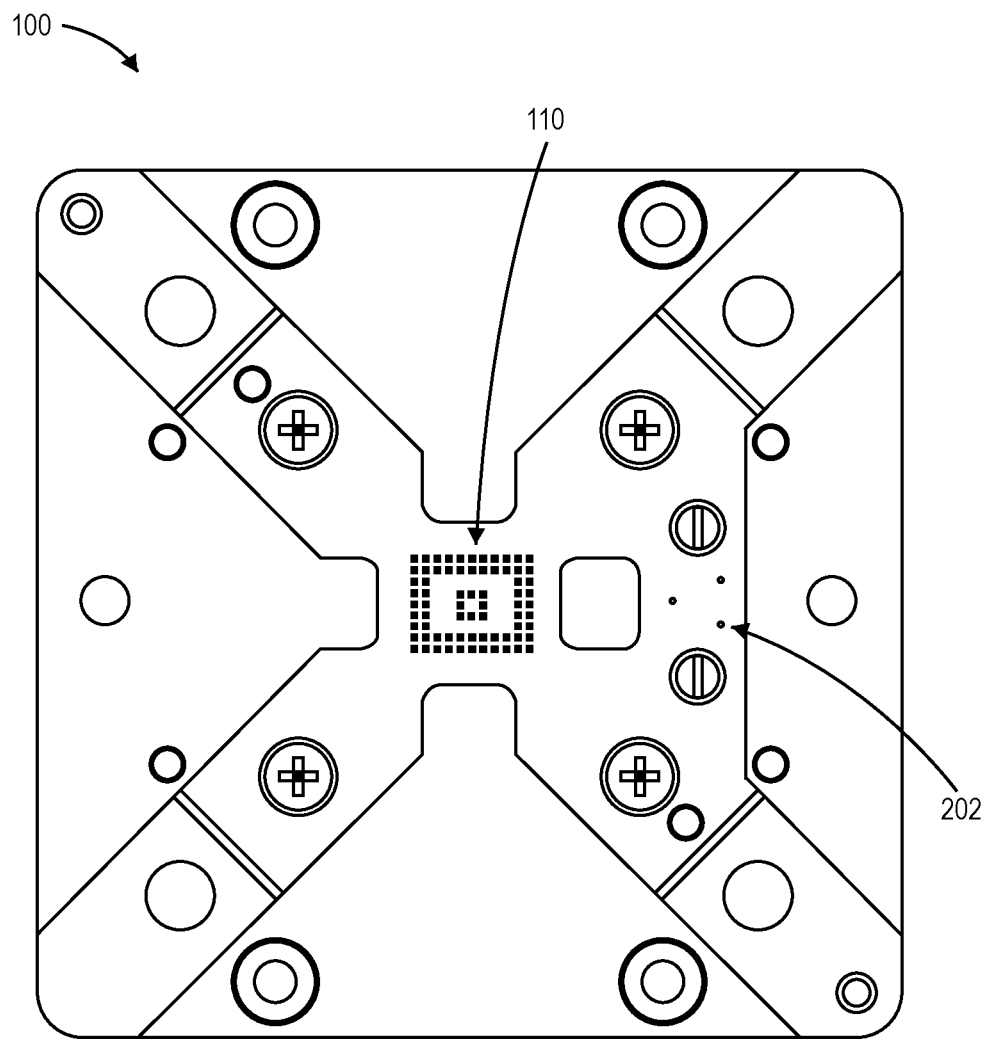
FIG. 2 illustrates a bottom side of the contactor of FIG. 1, according to various embodiments of the disclosure.

FIG. 2 illustrates a bottom side of the contactor 100 of FIG. 1, according to various embodiments of the disclosure. The bottom side of the contactor 100 is opposite to the top side of the contactor 100. The contactor 100 includes the pins 110. In particular, the pins 110 extend through the bottom side of the contactor 100 to interface with the interface board. The pins 110 can electrically couple with contacts of the interface board via the exposed portion of the pins 110 at the bottom side of the contactor 100 contacting the contacts of the interface board.

The contactor 100 further includes IC contacts 202. The IC contacts 202 are coupled to the embedded IC and facilitate communication with the embedded IC. In the illustrated embodiment, the embedded IC is embedded within the contactor 100 and the IC contacts 202 are electrically coupled with the embedded IC. The IC contacts 202 may be electrically coupled to contacts of the interface board and facilitate the transmission of communications between the embedded IC and the interface board.

Figure 3:
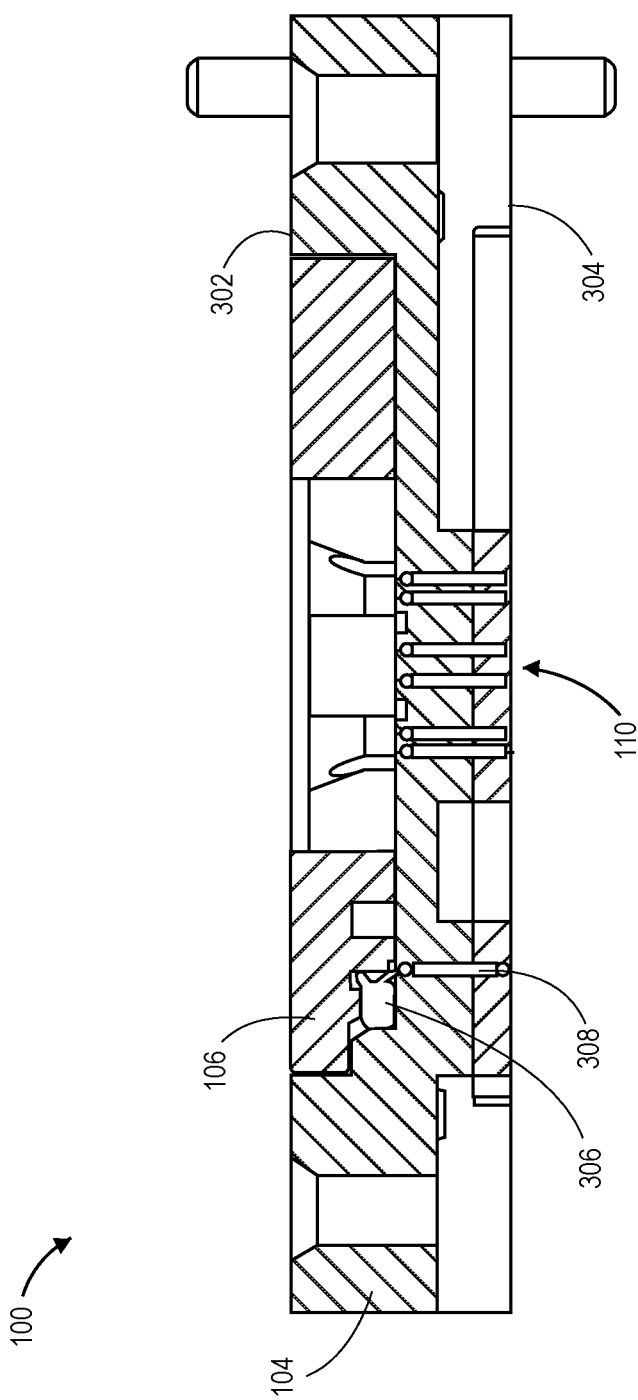
FIG. 3 illustrates a cross-sectional, side view of the contactor of FIG. 1, according to various embodiments of the disclosure.

FIG. 3 illustrates a cross-sectional, side view of the contactor 100 of FIG. 1, according to various embodiments of the disclosure. The contactor 100 includes the main body 104 with the fixed alignment frame 106 positioned against main body 104. In the illustrated embodiment, the pins 110 are recessed with the contactor 100 and extend through the contactor 100 from the top side 302 to the bottom side 304.

The contactor 100 includes embedded IC 306 with memory. The embedded IC 306 may be located between the main body 104 and the fixed alignment frame 106. In particular, the embedded IC 306 may be located in a cavity located between the main body 104 and the fixed alignment frame 106. An IC contact 308 of the IC contacts 202 (FIG. 2) can extend to the cavity and be electrically coupled to the embedded IC 306 to facilitate communication with the embedded IC 306. The IC contact 308 can extend to the embedded IC 306 from the bottom side 304 of the contactor 100. The IC contact 308 can be electrically coupled to a contact of the interface board and facilitate communication between the embedded IC 306 and the interface board.

Figure 4A:
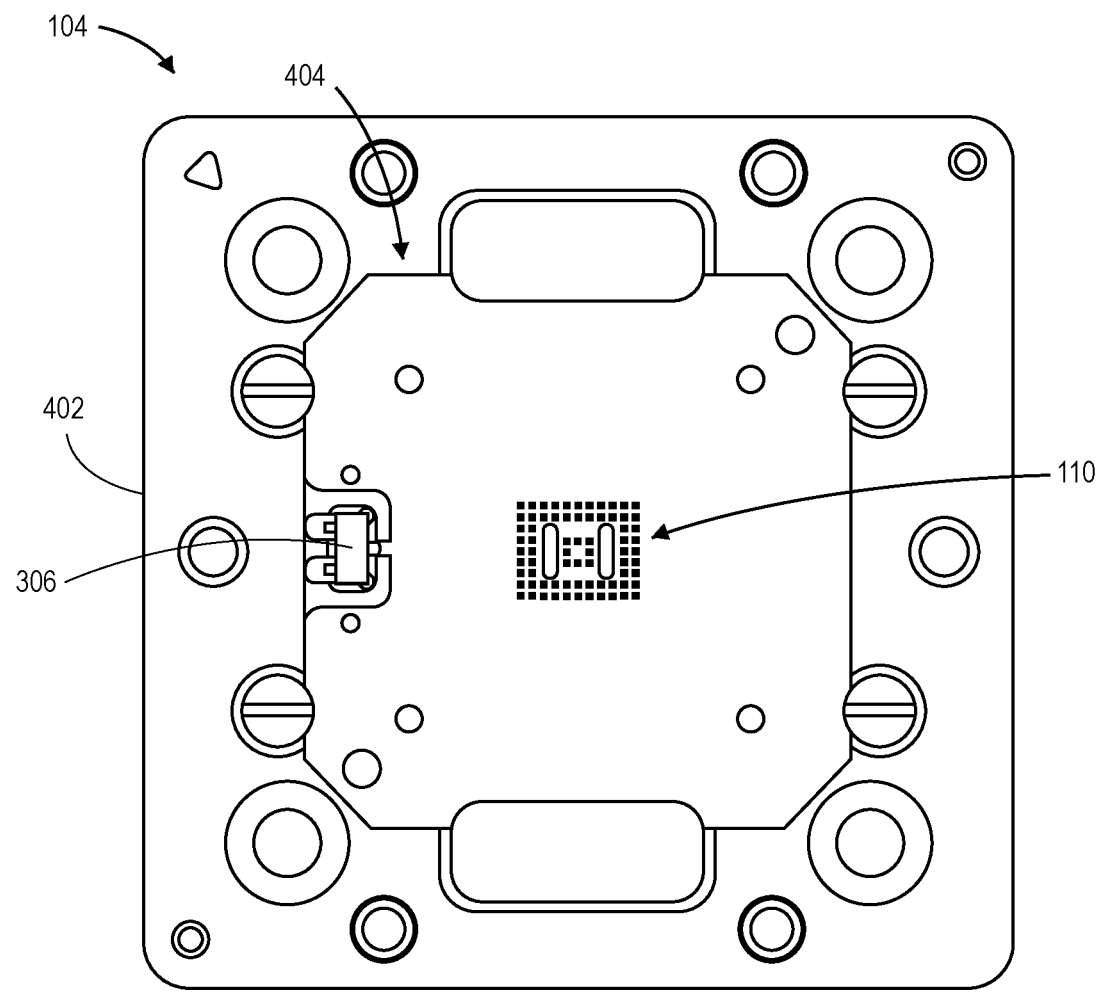
FIG. 4A illustrates a top view of the main body of the contactor of FIG. 1, according to various embodiments of the disclosure.

FIG. 4A illustrates a top view of the main body 104 of the contactor 100 of FIG. 1, according to various embodiments of the disclosure. In particular, FIG. 4A illustrates the side of the main body 104 against which the fixed alignment frame 106 (FIG. 1) is positioned. The main body 104 is illustrated without the fixed alignment frame 106 being present.

The contactor 100 includes the embedded IC 306 with memory. The embedded IC 306 may be located on a top surface of the main body 104. In some embodiments, the embedded IC 306 can be located in a recessed portion 404 of the main body 104 and may abut the recess. The fixed alignment frame 106 (FIG. 1) can be positioned in the recess and cover the embedded IC 306, thereby embedding the embedded IC 306 within the contactor 100 between the main body 104 and the fixed alignment frame 106. Further, the embedded IC 306 can be located between the pins 110 and an edge 402 of the main body 104. The embedded IC 306 can be coupled to the IC contacts 202 (FIG. 2) to facilitate communication with the embedded IC 306 via the IC contacts 202.

The embedded IC 306 comprises an IC package in the illustrated embodiment. In particular, the embedded IC 306 comprises a SOT23 package in the illustrated embodiment. The embedded IC 306 includes memory to store information related to contactor 100. In some embodiments, the embedded IC 306 can be a memory device with the SOT23 package. While an SOT23 is illustrated, it is to be understood that the embedded IC 306 can be embodied in any other IC packages in other embodiments.

Figure 4B:
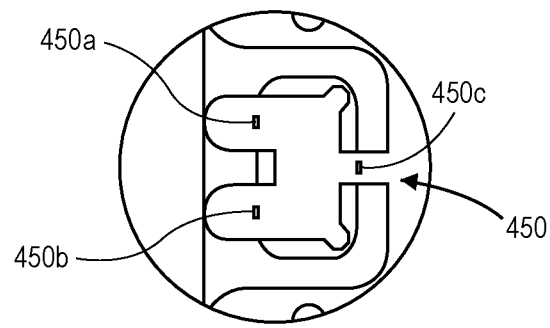
FIG. 4B illustrates an enlarged view of the portion of the main body where the integrated circuit (IC) is located, according to various embodiments of the disclosure

The main body 104 may further include one or more pads to which leads and/or pins of the embedded IC 306 are coupled. In particular, FIG. 4B illustrates an enlarged view of the portion of the main body 104 where the embedded IC 306 is located, according to various embodiments of the disclosure. FIG. 4B is illustrated without the embedded IC 306 mounted to the main body 104 to illustrate one or more pads 450 of the main body 104. In the illustrated embodiment, the main body 104 includes a first pad 450a, a second pad 450b, and a third pad 450c. Each of the pads 450 may be coupled to a corresponding lead or pin of the embedded IC 306. Further, each of the pads 450 may be coupled to, or may be part of, a corresponding IC contact of the IC contacts 202 (FIG. 2). In other embodiments, the location of the embedded IC 306, the dimensions of the cavity in which the embedded IC 306 is located, and/or the number of the pads 450 may differ in other embodiments based on the IC package in which the embedded IC 306 is embodied.

Figure 5:
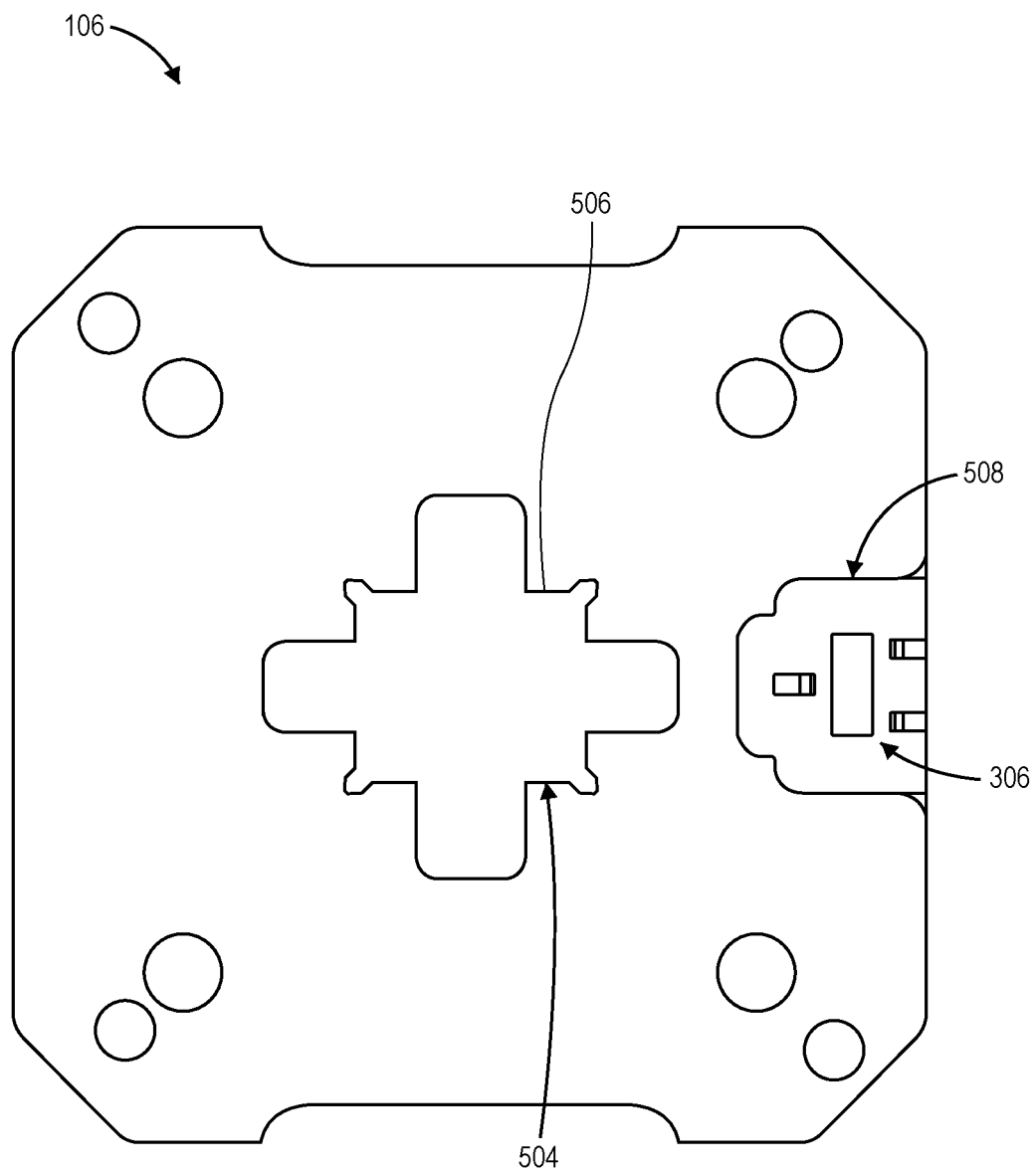
FIG. 5 illustrates a bottom view of the fixed alignment frame, according to various embodiments of the disclosure.

FIG. 5 illustrates a bottom view of the fixed alignment frame 106, according to various embodiments of the disclosure. In particular, the side of the fixed alignment frame that abuts the main body 104 (FIG. 1) when the fixed alignment frame 106 is positioned on the main body 104 is illustrated.

The fixed alignment frame 106 has an opening 504 located in the fixed alignment frame 106. The opening 504 may be located at a center of the fixed alignment frame 106. The opening 504 may align with the position of the pins 110 (FIG. 1) when the fixed alignment frame 106 is positioned on the main body 104, such that the pins 110 remain exposed when the fixed alignment frame 106 is positioned on the main body 104. The opening 504 in the fixed alignment frame 106 may facilitate alignment of the product with the pins 110 when the fixed alignment frame 106 is positioned on the main body 104. For example, sidewalls 506 encircling the opening 504 may be shaped to facilitate positioning of the product on the pins 110. The shape of the sidewalls 506 and the opening 504, or some portion thereof, may have a same shape as an outline of the product to facilitate the positioning of the product.

The fixed alignment frame 106 further includes a recessed portion 508 corresponding to a location of the embedded IC 306. FIG. 5 illustrates outlines of a portion of the embedded IC 306 to illustrate the relationship between the position of the embedded IC 306 and the recessed portion 508. When the fixed alignment frame 106 is positioned on the main body 104, the recessed portion 508 is positioned over the embedded IC 306 and forms a cavity in which the embedded IC 306 resides when the fixed alignment frame 106 is positioned on the main body 104. In other embodiments, the recessed portion 508 of the fixed alignment frame 106 may be omitted and the main body 104 may include a recessed portion to form a cavity in which the embedded IC 306 resides when the fixed alignment frame 106 is positioned on the main body 104.

Figure 6:
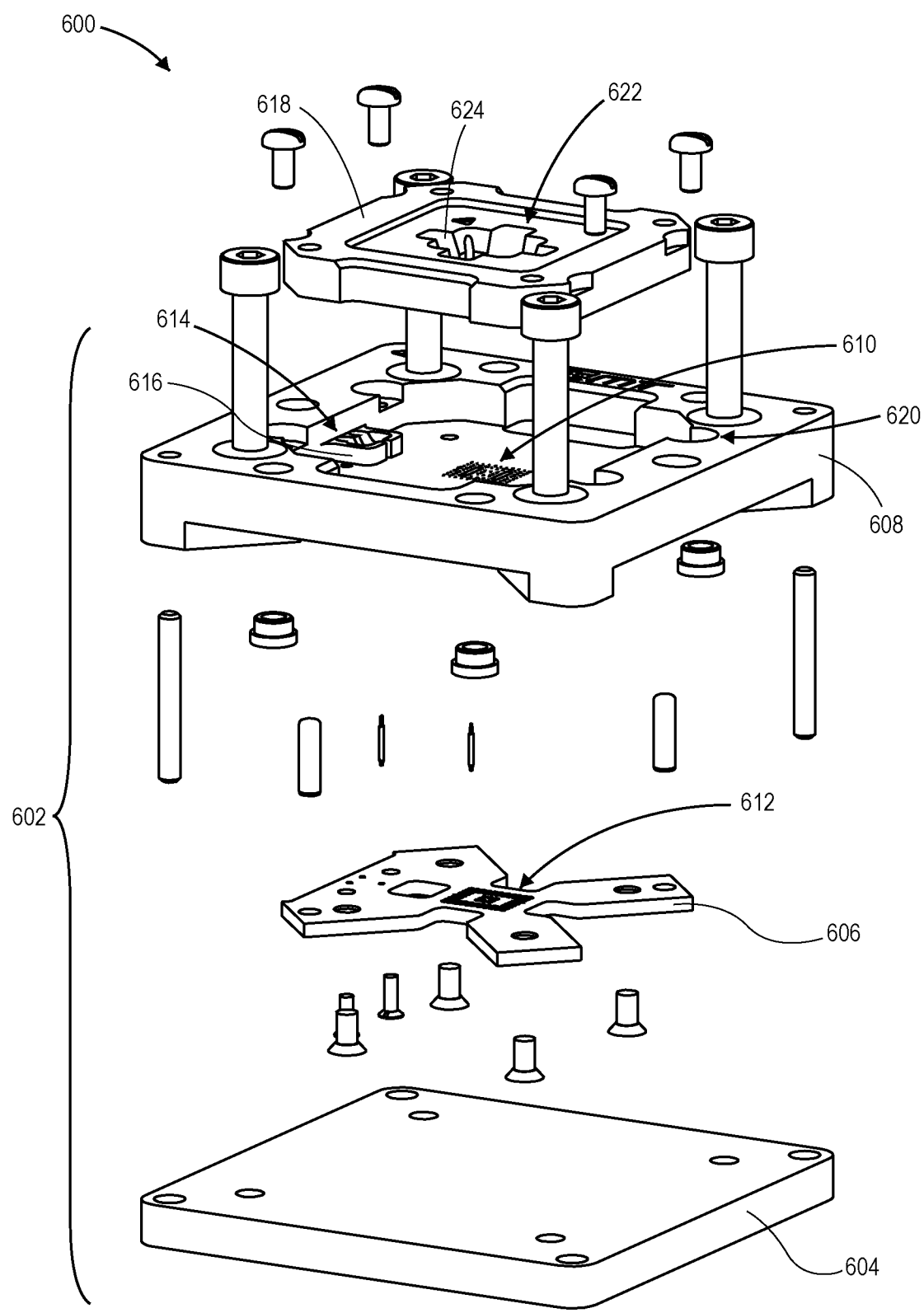
FIG. 6 illustrates an exploded view of an example contactor, according to various embodiments of the disclosure.

FIG. 6 illustrates an exploded view of an example contactor 600, according to various embodiments of the disclosure. The contactor 100 (FIG. 1) may include one or more of the features of the contactor 600.

The contactor 600 may include a main body 602. The main body 602 may include a bottom cover 604, a probe retainer plate 606, a top cover 608, or some combination thereof. In the illustrated embodiment, the main body 602 includes the bottom cover 604, the probe retainer plate 606, and the top cover 608. The probe retainer plate 606 may be located between the bottom cover 604 and the top cover 608. The top cover 608 may be affixed to the bottom cover 604 via one or more fasteners (such as screws and/or dowels) with the probe retainer plate 606 located between the top cover 608 and the bottom cover 604. The probe retainer plate 606 may be affixed to the bottom cover 604 and/or the top cover 608 via one or more fasteners (such as screws and/or dowels). In other embodiments, one or more of the bottom cover 604, the probe retainer plate 606, and the top cover 608 can be combined into a single piece, where the piece is included in the main body 602.

The top cover 608 may include one or more apertures 610 located in the top cover 608. The apertures 610 may form the recesses of the pins 110 (FIG. 1) when the top cover is affixed to the bottom cover 604. The probe retainer plate 606 may include one or more receptors 612. The receptors 612 may be electrically conductive and may align with the apertures 610 of the top cover 608 when the probe retainer plate 606 is positioned between the top cover 608 and the bottom cover 604. The receptors 612 may form or include the electrically-conductive portion of the pins 110. When the product is positioned on the contactor 600, the contacts of the product extend through the apertures 610 of the top cover 608 and electrically couple with the receptors 612. The probe retainer plate 606 may further include conductive portions (such as traces, vias, and/or conductive layers) that are coupled to the receptors 612 that facilitate electrical coupling between the receptors 612 and a test system.

The top cover 608 may further include a mounting location 614 at which an embedded IC (such as the embedded IC 306 (FIG. 3)) can be mounted. The pads 450 (FIG. 4) may be located on a surface of the top cover 608 at the mounting location 614. The mounting location 614 may be at least partially encircled by sidewalls 616 that can protect the embedded IC mounted in the mounting location 614 from damage. Further, the pads 450 may be at least partially encircled by the sidewalls 616.

The contactor 600 may further include a fixed alignment frame 618. The fixed alignment frame 618 may be affixed in a recess 620 of the top cover 608 via one or more fasteners (such as screws and/or dowels). In particular, the fixed alignment frame 618 may be affixed to the top cover 608 on an opposite side of the top cover 608 from the probe retainer plate 606. The fixed alignment frame 618 may cover the mounting location 614 and the embedded IC when the fixed alignment frame 618 is affixed on the top cover 608. The fixed alignment frame 618 and the top cover 608 may surround the mounting location 614, thereby creating a cavity for in which the embedded IC resides. For example, the fixed alignment frame 618 may include a recessed portion (such as the recessed portion 508 (FIG. 5)) that aligns with the mounting location 614 and helps to form the cavity for the embedded IC.

The fixed alignment frame 618 may have an opening 622 located in the fixed alignment frame 618. The opening 622 can align with the apertures 610 of the top cover 608 when the fixed alignment frame 618 is affixed to the top cover 608, thereby leaving the apertures 610 exposed. A product to be tested with the contactor 600 can be positioned in the opening 622 with the contacts of the product extending through the apertures 610 of the top cover 608 and engaging with the receptors 612 of the probe retainer plate 606. The sidewalls 624 of the fixed alignment frame 618 that encircle the opening 622 may facilitate positioning of the product. In particular, the sidewalls 624, or some portion thereof, may have a same shape as the product and may help guide the contacts of the product into the apertures 610 when the product is being positioned on the contactor 600. In some embodiments, the sidewalls 624 may be tapered approaching the side of the fixed alignment frame 618 that is to be positioned against the top cover 608.

Figure 7:
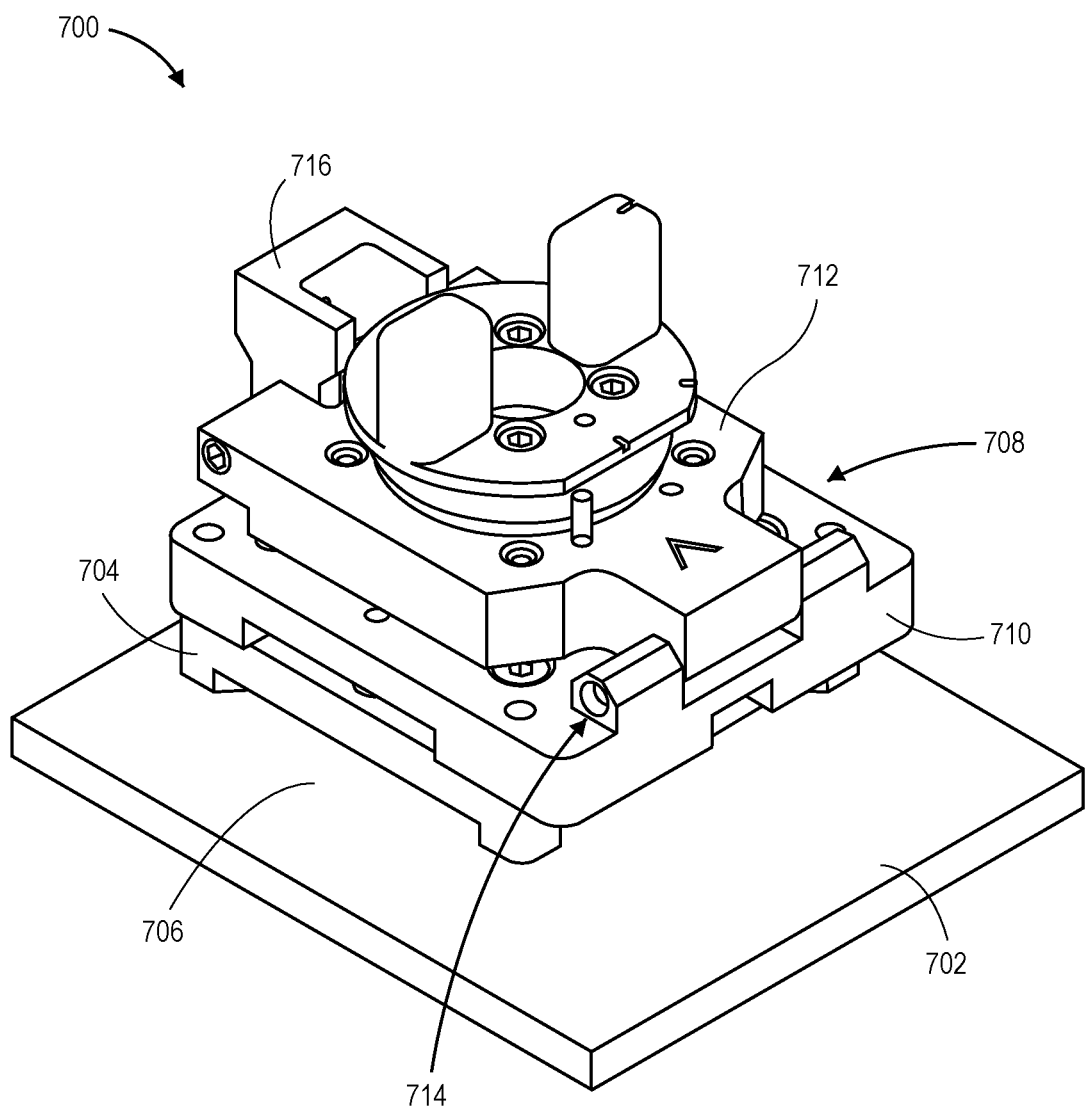
FIG. 7 illustrates an example test arrangement, according to various embodiments of the disclosure.

FIG. 7 illustrates an example test arrangement 700, according to various embodiments of the disclosure. The test arrangement 700 can be utilized for production testing of a product (such as an IC package or an IC wafer). The test arrangement 700 can utilize a contactor (such as the contactor 100 (FIG. 1) and/or the contactor 600 (FIG. 6)) for the testing of the product.

The test arrangement 700 may include an interface board 702. The interface board 702 may be communicatively coupled to a test system (such as the test system 1104 (FIG. 11)) and facilitate communication between the test arrangement 700 and the test system. For example, the interface board 702 may receive communications from the test system that cause the test arrangement 700 to perform one or more operations (such as performing a test procedure for a product positioned in test arrangement 700) and can provide communications to the test system. While a particular embodiment of the interface board 702 is illustrated, it is to be understood that the interface board 702 may be different sizes in other embodiments, where the interface board 702 may be larger in other embodiments.

The test arrangement 700 may further include a contactor 704. The contactor 704 may include one or more of the features of the contactor 100 and/or the contactor 600. For example, the contactor 704 may include an embedded IC with memory (such as the embedded IC 306). In some embodiments, the embedded IC may comprise a memory device. The embedded IC may store information related to the contactor 704, such as an identifier of the contactor 704, an identifier of the memory, a number of uses of the contactor, a number of uses of the contactor since a replaceable component was replaced, an amount of impedance of each of the pins (such as the pins 110 (FIG. 1)) of the contactor 704, or some combination thereof. The contactor 704 may further include one or more pins (such as the pins 110) that are to receive contacts of the product under test.

The contactor 704 may be positioned against a surface of the interface board 702. In particular, the contactor 704 may be positioned against a top surface 706 of the interface board 702. Portions of the contactor 704 may be electrically coupled to the interface board 702. In particular, the embedded IC and the pins of the contactor 704 can be electrically coupled to the interface board 702. The interface board 702 can facilitate testing of the product via the pins of the contactor 704. In particular, the interface board 702 can receive communications from the test system and cause a test operation to be applied to the product positioned on the contactor 704 via the pins of the contactor 704. The interface board 702 can further provide the results of the test operation to the test system. The interface board 702 can further facilitate communication between the embedded IC and the test system. For example, the test system may retrieve information (such as an identifier of the contactor 704, an identifier of the memory, a number of uses of the contactor 704, a number of uses of the contactor 704 since a replaceable component had been replaced, impedances of the pins of the contactor 704, a temperature of the contactor 704 determined by the embedded IC, or some combination thereof) from the embedded IC via the interface board 702. The test system may further cause information stored by the embedded IC to be updated, such as the number of uses of the contactor 704 and/or the number of uses of the contactor 704 since a replaceable component had been replaced.

The test arrangement 700 may further include an actuator assembly 708. The actuator assembly 708 may include a base 710 and a cover 712. The base 710 may be positioned on a side of the contactor 704 opposite from the interface board 702. In particular, the contactor 704 may be located between the base 710 and the interface board 702. The contactor 704 may be included with the actuator assembly 708 in some embodiments. The base 710 may include an opening located over the pins of the contactor 704, where the opening can expose the pins. The cover 712 is attached to the base 710 via a hinge 714, where the cover 712 may rotate relative to the base 710 about the hinge 714. The cover 712 can be rotated away from the base 710 for positioning of the product on contactor 704. In particular, when the cover 712 is rotated away from the base 710, the opening of the base 710 can expose the pins of the contactor 704 and the product can be positioned on the pins. With the product positioned on the pins, the cover 712 can be rotated toward the base 710 and apply a force to the product to plunge the product on the pins of the contactor 704. The cover 712 can maintain the application of the force to the product while the product is being tested. The actuator assembly 708 can further include a latch 716 that can latch the cover 712 and the base 710 and maintain a distance between the base 710 and the cover 712 when the latch 716 is latched. In some embodiments, the latch 716 may be omitted from the actuator assembly 708. Further, the actuator assembly 708 may be omitted from test arrangement 700 in some embodiments. In some embodiments, the actuator assembly 708 may comprise, or may be replaced by, an automated test handler, where the automated test handler applies a force to plunge the product into the contactor 704. In other embodiments, the actuator assembly 708 may comprise a manual actuator, where a user applies a force, via the manual actuator, to plunge the product into the contactor 704.

Figure 8:
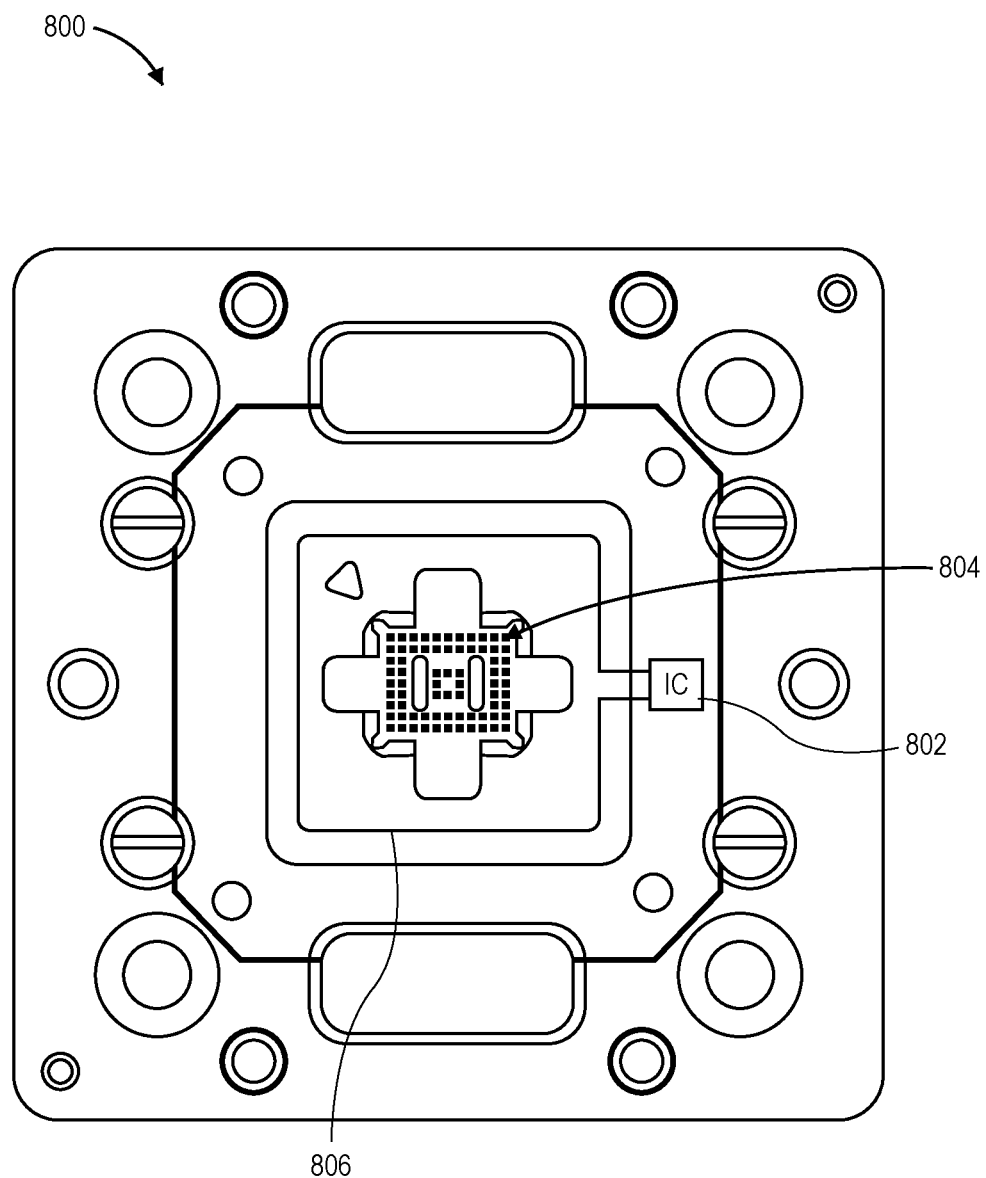
FIG. 8 illustrates a top view of another example contactor, according to various embodiments of the disclosure.

FIG. 8 illustrates a top view of another example contactor 800, according to various embodiments of the disclosure. The contactor 800 may include one or more of the features of the contactor 100 (FIG. 1), the contactor 600 (FIG. 6), and/or the contactor 704 (FIG. 7). For example, the contactor 800 may include an embedded IC 802 having memory, where the embedded IC 802 may include one or more of the features of the embedded IC 306 (FIG. 3).

The contactor 800 may further include a pressure sensor to sense the amount pressure between a product and the contactor 800. In particular, the product can be positioned on the top surface of the contactor 800 with a force applied to the product (such as by the actuator assembly 708 (FIG. 7)) that plunges contacts of the product into one or more pins 804 of the contactor 800. In the illustrated embodiment, the pressure sensor comprises a conductor that extends around a portion of the top surface of the contactor 800 where the product is to be positioned during testing. In particular, the conductor comprises a wire 806 in the illustrated embodiment. The wire 806 can be located on the top surface of the contactor 800. The wire 806 may be coupled to the embedded IC 802 where the embedded IC 802 can determine an impedance of the wire 806. The impedance of the wire 806 can change as the pressure between the product and the contactor 800 changes. Based on the impedance of the wire 806, the embedded IC 802 may determine (or facilitate determination by a test system coupled to the contactor 800) an amount of pressure between the product and the contactor 800. The determined amount of pressure can be stored in memory of the embedded IC 802 and/or provided to a test system coupled to the contactor 800. As the amount of pressure can affect the performance of the product during production testing, verifying that the amount of pressure is within an acceptable range can reduce the chance of unexpected effects on testing results that may be caused by pressures outside the acceptable range.

Figure 9:
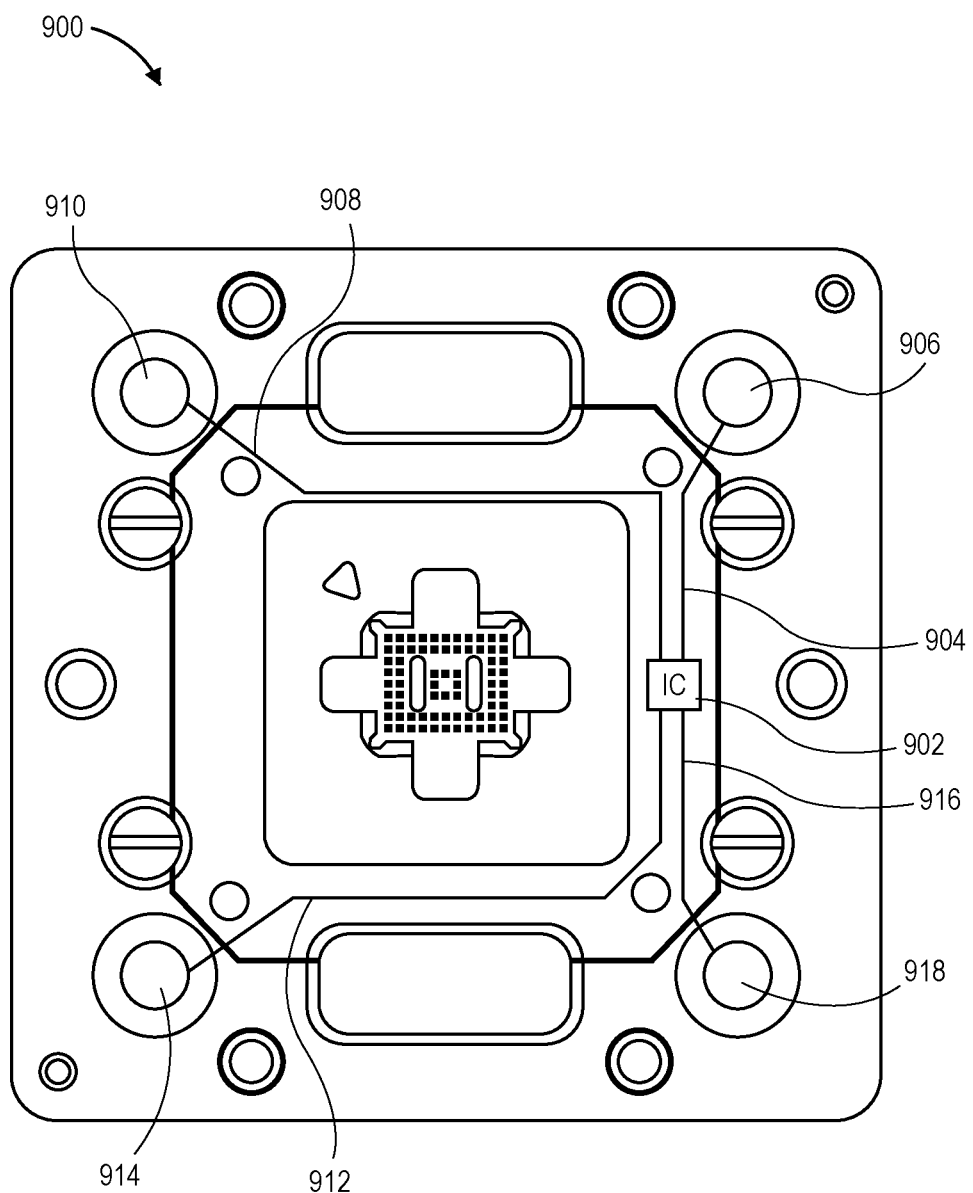
FIG. 9 illustrates a top view of another example contactor, according to various embodiments of the disclosure.

FIG. 9 illustrates a top view of another example contactor 900, according to various embodiments of the disclosure. The contactor 900 may include one or more of the features of the contactor 100 (FIG. 1), the contactor 600 (FIG. 6), the contactor 704 (FIG. 7), and/or the contactor 800 (FIG. 8). For example, the contactor 900 may include an embedded IC 902 having memory, where the embedded IC 902 may include one or more of the features of the embedded IC 306 (FIG. 3) and/or the embedded IC 802 (FIG. 8).

The contactor 900 may further include a fastener detector. In particular, the fastener detector can detect the presence of one or more fasteners that affix the contactor 900 within a test arrangement (such as the test arrangement 700 (FIG. 7)). For example, the fasteners may affix the contactor 900 to an interface board (such as the interface board 702 (FIG. 7)). In the illustrated embodiment, the fastener detector includes one or more electrically-conductive elements that extend to apertures in which the fasteners are to be installed. In particular, the contactor 900 includes a first conductive element 904 that extends to a first aperture 906, a second conductive element 908 that extends to a second aperture 910, a third conductive element 912 that extends to a third aperture 914, and a fourth conductive element 916 that extends to a fourth aperture 918. Each of the conductive elements may comprise one or more wires and/or traces that are embedded within the contactor 900. Further, each of the conductive elements may be coupled to the embedded IC 902. The embedded IC 902 may determine the presence of each of the fasteners in the apertures. For example, the embedded IC 902 may utilize the conductive elements to determine whether one or more electrical characteristics (such as completion of a circuit, a certain impedance range, and/or a certain capacitance range) that indicate the presence of the fasteners in the apertures exists and determine the presence of the fasteners based on the electrical characteristics. The embedded IC 902 may further determine whether any of the fasteners are missing and can provide an indication to a test system coupled to the contactor 900 that one or more of the fasteners are missing from the apertures.

Figure 10:
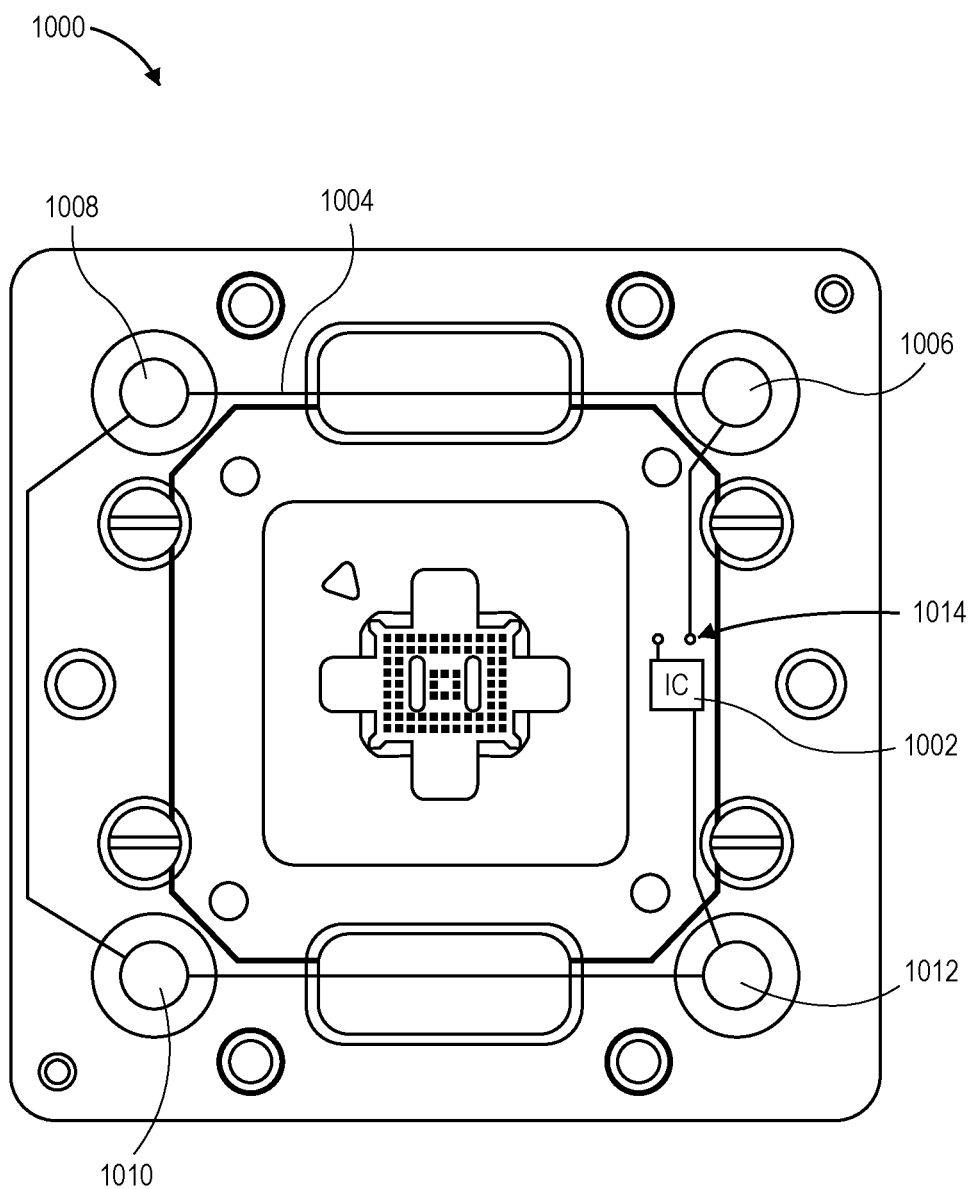
FIG. 10 illustrates another example contactor, according to various embodiments of the disclosure.

FIG. 10 illustrates another example contactor 1000, according to various embodiments of the disclosure. The contactor 1000 may include one or more of the features of the contactor 100 (FIG. 1), the contactor 600 (FIG. 6), the contactor 704 (FIG. 7), and/or the contactor 800 (FIG. 8). For example, the contactor 1000 may include an embedded IC 1002 having memory, where the embedded IC 1002 may include one or more of the features of the embedded IC 306 (FIG. 3) and/or the embedded IC 802 (FIG. 8).

The contactor 1000 may further include a fastener detector. In particular, the fastener detector can detect the presence of one or more fasteners that affix the contactor 1000 within a test arrangement (such as the test arrangement 700 (FIG. 7)). For example, the fasteners may affix the contactor 1000 to an interface board (such as the interface board 702 (FIG. 7)). In the illustrated embodiment, the fastener detector includes a series 1004 of electrically-conductive elements that extend to each of the apertures in which the fasteners are to be installed. In particular, the series 1004 of electrically-conductive elements include conductive elements that extend from a first aperture 1006 to a second aperture 1008, from the second aperture 1008 to a third aperture 1010, and from the third aperture 1010 to a fourth aperture 1012. The series 1004 of electrically-conductive elements are further coupled to IC contacts 1014 of the contactor 1000 and the embedded IC 1002. The series 1004 of electrically-conductive elements may be embedded within the contactor 1000. When the fasteners are positioned in the first aperture 1006, the second aperture 1008, the third aperture 1010, and the fourth aperture 1012, the series 1004 of electrically-conductive elements, the fasteners, and the embedded IC 1002 complete a circuit from one of the IC contacts 1014 to another of the IC contacts 1014. For example, one of the IC contacts 1014 may be coupled to the embedded IC 1002 via a portion of the series 1004 of electrically-conductive elements, while another of the contacts may be coupled to the embedded IC 1002 via another portion of the series 1004 of electrically-conductive elements and the fasteners when positioned in the apertures. In other embodiments, one or more of the IC contacts 1014 can be directly coupled to the embedded IC 1002. If any of the fasteners are omitted from any of the apertures, the circuit is broken and can be utilized to determine that one of the fasteners has been omitted. The embedded IC 1002 and/or a test system coupled to the contactor 1000 can determine whether any of the fasteners are missing based on whether the circuit is broken or complete. While the embodiments refer to two of the IC contacts 1014 in the illustrated embodiment, it is to be understood that the IC contacts 1014 may include more than two IC contacts, such as an array of IC contacts, in other embodiments.

Figure 11:
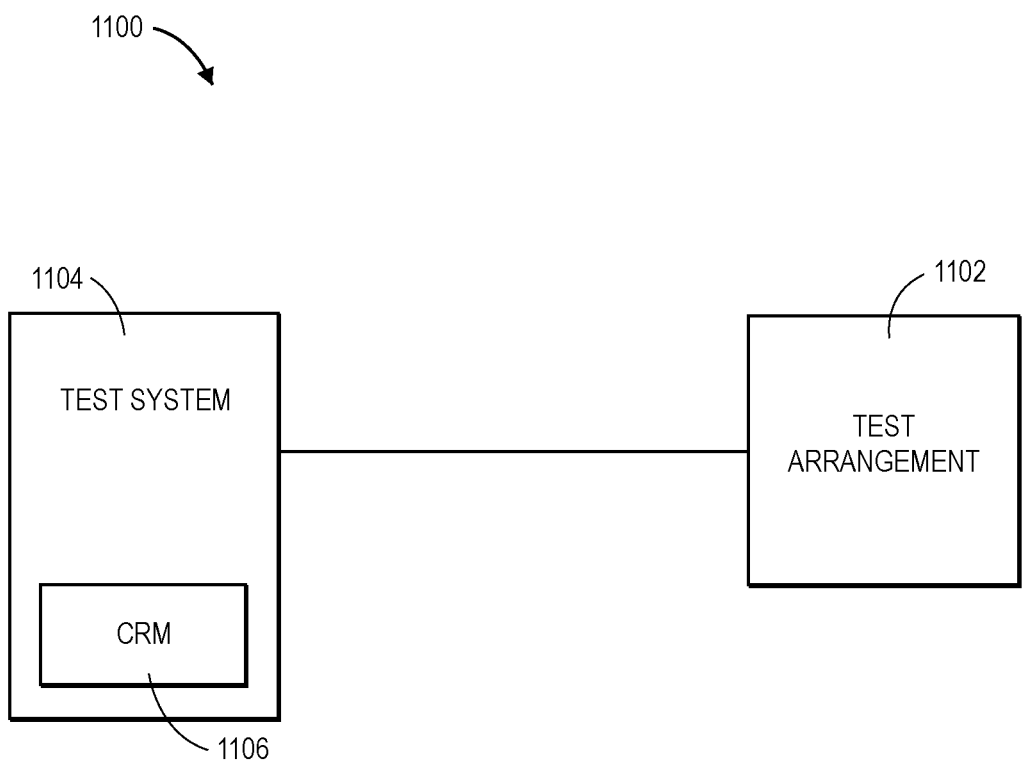
FIG. 11 illustrates a test fixture, according to various embodiments of the disclosure.

FIG. 11 illustrates a test fixture 1100, according to various embodiments of the disclosure. The test fixture 1100 may be utilized for production testing of a products (such as IC packages and/or IC wafers).

The test fixture 1100 includes a test arrangement 1102. The test arrangement 1102 may include one or more of the features of the test arrangement 700 (FIG. 7). In particular, the test arrangement 1102 may include an actuator assembly (such as the actuator assembly 708 (FIG. 7)), a contactor, and an interface board (such as the interface board 702 (FIG. 7)), in some embodiments. The contactor may comprise the contactor 100 (FIG. 1), the contactor 600 (FIG. 6), the contactor 704 (FIG. 7), the contactor 800 (FIG. 8), the contactor 900 (FIG. 9), or the contactor 1000 (FIG. 10).

The test fixture 1100 further includes a test system 1104. The test system 1104 may comprise a computer device (such as a desktop computer, a laptop computer, a server, an application-specific computer, or other computer devices capable of performing the procedures described herein). The test system 1104 may be communicatively coupled to the test arrangement 1102, such as via a wired communication coupling or a wireless communication coupling. For example, the test system 1104 may be communicatively coupled to the contactor of the test arrangement 1102. In some embodiments, the test system 1104 may be communicatively coupled to an interface board (such as the interface board 702 (FIG. 7)), where the interface board may in turn be communicatively coupled to the contactor, thereby communicatively coupling the test system 1104 to the contactor. Due to the communicative coupling, the test system 1104 can communicate with an embedded IC of the contactor, such as the embedded IC 306 (FIG. 3), the embedded IC 802 (FIG. 8), the embedded IC 902 (FIG. 9), and/or the embedded IC 1002 (FIG. 10).

The test system 1104 can utilize the test arrangement 1102 for testing a product positioned on the test arrangement 1102. In particular, the test system 1104 can cause a test procedure to be applied to the product and receive results of the test procedure and/or measurements obtained during the test procedure. Based on the results of the test procedure and/or the measurements obtained during the test procedure, the test system 1104 can determine if the product is operating as intended. The test system 1104 can indicate to a user (such as displaying an indication on a screen of the test system 1104, emitting a sound from the test system 1104, placing an entry in a log of test procedure results, or some combination thereof) whether the product is operating as intended based on the determination by the test system 1104.

The test system 1104 may further obtain information from the embedded IC of the contactor. In some embodiments, the information can be obtained by the test system 1104 at a beginning of the test procedure. For example, the test system 1104 may retrieve and/or be provided any of the information stored in the memory of the embedded IC, such as an identifier of the contactor, an identifier of the memory, a number of uses of the contactor, a number of uses of the contactor since a replaceable component has been replaced, resistance of the pins (such as the pins 110 (FIG. 1) and/or the pins 804 (FIG. 8)), and/or other information related to the contactor stored in the memory of the embedded IC. If any of the information retrieved by or provided to the test system 1104 indicates that maintenance of contactor should be performed or that the test system 1104 determines should be performed based on the information, the test system 1104 may indicate to a user (such as displaying an indication on a screen of the test system 1104, emitting a sound from the test system 1104, placing an entry in a log of test procedure results, or some combination thereof) that the maintenance should be performed. For example, the information provided to the test system 1104 may indicate, or the test system 1104 may determine based on the information, that a threshold number of uses since a replaceable component had been replaced has been exceeded and the test system 1104 can indicate to the user that the replaceable component should be replaced based on the threshold number being exceeded. The test system 1104 may further update information stored in the memory of the embedded IC, such as updating the number of uses of the contactor, the number of uses of the contactor since a replaceable component has been replaced, or other information related to the contactor stored in the memory. The test system 1104 may update the information at the beginning of the test procedure, during the test procedure, at completion of the test procedure, or some combination thereof.

In some embodiments, the test system 1104 can further assign an identifier to the contactor. For example, the test system 1104 may determine whether an identifier has been assigned to the contactor based on an inquiry of the memory of the embedded IC and assign an identifier to the contactor in response to a determination that an identifier has not been assigned to the contactor in some embodiments. The test system 1104 may generate a unique identifier for the contactor or obtain an unused identifier from a group of predefined identifiers to be assigned to the contactor. The identifier assigned by the test system 1104 may then be stored in the memory of the embedded IC. In some embodiments, the test system 1104 may reassign an identifier to the contactor regardless of whether an identifier is stored in the memory of the embedded IC. In other embodiments, the identifier may be stored in the memory of the embedded IC during production of the contactor and the test system 1104 may not assign or reassign an identifier to the contactor.

In some embodiments, the test system 1104 may further receive results of operations performed by the embedded IC. For example, the test system 1104 may receive the results of a temperature of the contactor determination operation performed by the embedded IC. In some embodiments, the test system 1104 may receive an indication of a temperature of the contactor from the embedded IC, where the embedded IC may determine the temperature of the contactor utilizing a diode of the embedded IC. The embedded IC may determine the temperature of the contactor based on electrical characteristics of the diode that can be affected by the temperature of the contactor, such as the voltage drop across the diode when a constant current is made to flow through the diode. Further, the test system 1104 may receive from the embedded IC indications of whether the pressure between the product and the contactor is outside of an acceptable range and/or whether certain fasteners have not been positioned in certain apertures of the contactor in some embodiments, such as embodiments that implement the contactor 800, the contactor 900, or the contactor 1000. If the test system 1104 determines that the temperature and/or the pressure are outside of an acceptable range, or that fasteners have not been positioned in the certain apertures, the test system 1104 may indicate to the user (such as displaying an indication on a screen of the test system 1104, emitting a sound from the test system 1104, placing an entry in a log of test procedure results, or some combination thereof) that remedial action should be taken.

The test system 1104 may include one or more computer-readable mediums (CRMs) 1106 having one or more instructions stored thereon that facilitate communication between the test system 1104 and the test arrangement 1102, and implement the operations performed by the test system 1104 described throughout this disclosure. For example, the instructions stored in the CRMs 1106 may facilitate communication between the test system 1104 and the embedded IC, which allows the test system 1104 to receive the information from the embedded IC, update the information stored in the memory of the embedded IC, and receive the results of the operations performed by the embedded IC. The CRMs 1106 can be non-transitory CRMs.

Figure 12:
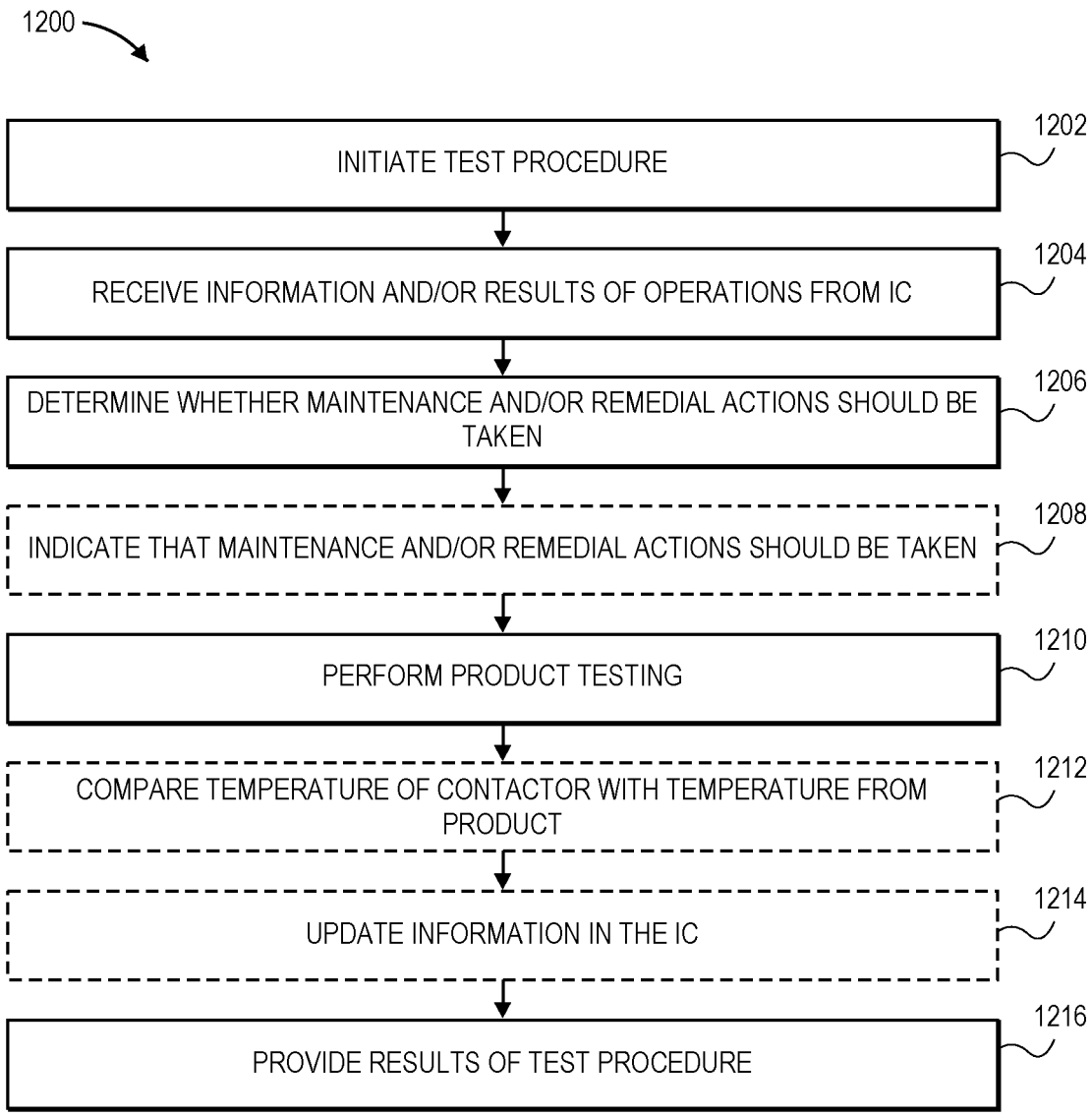
FIG. 12 illustrates an example procedure that can be performed by a test fixture, according to various embodiments of the disclosure.

FIG. 12 illustrates an example procedure 1200 that can be performed by a test fixture, according to various embodiments of the disclosure. For example, the procedure 1200 may be performed by the test fixture 1100 (FIG. 11). The procedure 1200 can be implemented by a test system of the test fixture, such as the test system 1104 (FIG. 11). For example, one or more instructions can be stored in one or more CRMs (such as the CRMs 1106 (FIG. 11)), where the instructions, when executed by the test system, can cause the test system to perform the procedure 1200.

The procedure 1200 may initiate with stage 1202. In stage 1202, a test procedure for a product positioned on a test arrangement (such as the test arrangement 1102 (FIG. 11)) may be initiated. The test procedure may be initiated in response to a user input that the test procedure is to be initiated or another indication that the test procedure is to be initiated.

In stage 1204, the test system may receive information and/or results of operations from an embedded IC of a contactor within the test arrangement. For example, the test system may receive from the embedded IC indications of an identifier of the contactor, an identifier of the memory, a number of uses of the contactor, a number of uses of the contactor since a replaceable component was replaced, a number of impedance of each of the pins of the contactor, a temperature of the contactor, an amount of pressure between the contactor and the product, presence of fasteners in certain apertures of the contactor, or some combination thereof. The test system may determine an identity of the contactor based on an identifier received from the embedded IC.

In stage 1206, the test system may determine whether maintenance and/or remedial actions should be taken. For example, the test system may determine whether one or more replaceable components of the contactor should be replaced based on the identifier of the contactor, the identifier of the memory, the number of uses of the contactor, and/or the number of uses of the contactor since the replaceable components were replaced. For example, the test system may compare the number of uses of the contactor with a threshold number of uses of the contactor set based on the last replacement of the replaceable components and/or compare the number of uses of the contactor since the replaceable components were replaced with threshold numbers of uses of the contactor corresponding to each of the replaceable components. Further, the test system may determine whether remedial actions should be taken based on the temperature of the contactor, the amount of pressure between the contactor, and/or the presence of the fasteners in the certain apertures of the contactor.

In stage 1208, the test system may indicate whether maintenance and/or remedial actions should be taken. In particular, the test system may indicate that maintenance and/or remedial actions should be taken in response to the test system determining that maintenance and/or remedial actions should be taken. The test system may further indicate what maintenance and/or remedial actions should be taken. In instances where the test system determines that there are no maintenance and/or remedial actions to be taken, stage 1208 may be omitted and the procedure 1200 may proceed to stage 1210.

In stage 1210, the test system may perform product testing. In particular, the test system may utilize the test fixture to perform testing of the product positioned on the test fixture. The test system may initiate a procedure corresponding to the product to test the product.

In stage 1212, the test system may compare the temperature of the contactor received from the embedded IC of the contactor with a temperature detected by the product. Based on the comparison, the test system may determine whether the temperature detected by the product is properly calibrated. The test system may indicate that the temperature detected by the product is not properly calibrated based on the test system determining that a difference between the temperature received from the embedded IC and the temperature detected by the product exceeds a threshold amount. Stage 1212 may be performed in instances where the product under test detects a temperature of the product or an ambient temperature surrounding the product. In instances where the product does not detect a temperature or the test system has been configured not to compare the temperatures, stage 1212 may be omitted.

In stage 1214, the test system may update the information stored in the memory of the embedded IC in the contactor. For example, the test system may cause the number of uses of the contactor and/or the number of uses of the contactor since a replaceable component had been replaced to be incremented.

In stage 1216, the test system may provide the results of the test procedure. For example, the test system may display the results of the test procedure on a screen of the test system and/or store the results in a log of results.

While an embodiment of the procedure 1200 is illustrated, it is to be understood that in other embodiments that one or more of the stages illustrated, or portions thereof, may be performed in a different order than shown and/or concurrently with other stages.

Example Implementations

The following examples are provided by way of illustration.

Example 1 may include a contactor to receive a product and electrically couple the product to an interface board of a test arrangement, the contactor comprising a body to receive the product and couple to the interface board, the body having one or more pins to electrically couple the product to the interface board, and an integrated circuit (IC) located in the body, wherein the IC includes memory for storing information related to the contactor.

Example 2 may include the contactor of example 1, wherein the IC is to store an identifier of the contactor in the memory.

Example 3 may include the contactor of example 1, wherein the IC is to store an indication of a number of uses of the contactor in the memory.

Example 4 may include the contactor of example 1, wherein the IC is to store an indication of a number of uses since a replaceable component has been replaced.

Example 5 may include the contactor of example 4, wherein the replaceable component comprises the one or more pins, a guide plate of the contactor, or one or more elastomer elements of the contactor.

Example 6 may include the contactor of example 1, wherein the IC is to determine a temperature of the contactor.

Example 7 may include the contactor of example 6, wherein the IC includes a diode, and wherein the IC utilizes the diode to determine the temperature of the contactor.

Example 8 may include the contactor of example 1, wherein the IC is embedded within the body.

Example 9 may include the contactor of example 1, wherein the body includes a main body and a fixed alignment frame, and wherein the IC is located between the main body and the fixed alignment frame.

Example 10 may include the contactor of example 1, wherein the product is an integrated circuit package or an integrated circuit wafer.

Example 11 may include the contactor of example 1, wherein the IC is a memory device.

Example 12 may include a test fixture for testing a product, the test fixture comprising a test arrangement that includes a contactor, wherein the contactor includes a body to receive the product and an integrated circuit (IC) located in the body, wherein the IC includes memory for storing information related to the contactor, and a test system communicatively coupled to the IC, wherein the test system is to retrieve at a least a portion of the information related to the contactor from the memory.

Example 13 may include the test fixture of example 12, wherein the memory is to store an identifier of the contactor, and wherein the test system is to retrieve the identifier of the contactor from the memory.

Example 14 may include the test fixture of example 12, wherein the IC is to store an indication of a number of uses since a replaceable component had been replaced, wherein the test system is to retrieve the indication of the number of uses since the replaceable component had been replaced, and wherein the test system is to indicate that the replaceable component is to be replaced if the number of uses since the replaceable component had been replaced exceeds a predetermined value.

Example 15 may include the test fixture of example 12, wherein the test arrangement further includes an interface board located on a first side of the body, wherein the body receives the product on a second side of the body, and wherein the contactor includes one or more pins that provide an interface between the product and the interface board when the product has been received.

Example 16 may include the test fixture of example 12, wherein the IC includes a diode, wherein the IC is to utilize the diode to determine a temperature of the contactor, and wherein the test system is to retrieve the temperature of the contactor from the IC.

Example 17 may include the test fixture of example 12, wherein the IC is a memory device, and wherein the IC is embedded within the body.

Example 18 may include a method of determining information related to a contactor utilized for testing of products by a test system, comprising retrieving, by the test system, an identifier of the contactor from a memory of an integrated circuit (IC) located within the contactor, and determining, by the test system, an identity of the contactor based on the identifier retrieved from the memory.

Example 19 may include the method of example 18, further comprising retrieving, by the test system, an indication of a number of uses of the contactor since a replaceable component had been replaced from the memory, comparing, by the test system, the number of uses to a threshold number of uses of the contactor corresponding to the replaceable component, and determining, by the test system, whether the replaceable component is to be replaced based on the comparison of the number of uses with the threshold number of uses.

Example 20 may include the method of example 18, further comprising retrieving, by the test system, an indication of a temperature of the contactor from the IC, wherein the IC determined the temperature via a diode of the IC, comparing, by the test system, the temperature of the contactor with a temperature of a product under test indicated to the test system by the product under test, and determining, by the test system, a validity of the temperature of the product under test based on the comparison of the temperature of the contactor with the temperature of the product under test.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present specification.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In some cases, the teachings of the present specification may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Additionally, some of the components associated with described microprocessors may be removed, or otherwise consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, equipment options, etc.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read-only memory (EPROM), an electrically erasable programmable read-only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof. In operation, processors may store information in any suitable type of non-transitory storage medium (for example, random-access memory (RAM), read-only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe. Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the figures may be combined in various possible configurations, all of which are clearly within the broad scope of this disclosure. In certain cases, it may be easier to describe one or more of the functionalities of a given set of flows by only referencing a limited number of electrical elements. It should be appreciated that the electrical circuits of the figures and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the specification, to limit this disclosure in any way that is not otherwise reflected in the appended claims.

What is claimed is:

1. A contactor to receive a product and electrically couple the product to an interface board of a test arrangement, the contactor comprising:
a body to receive the product and couple to the interface board, the body having one or more pins to electrically couple the product to the interface board; and
an integrated circuit (IC) located in the body, wherein the IC includes memory for storing information related to the contactor, including an indication of a number of uses since a replaceable component has been replaced.

2. The contactor of claim 1, wherein the IC is to store an identifier of the contactor in the memory.

3. The contactor of claim 1, wherein the IC is to store an indication of a number of uses of the contactor in the memory.

4. The contactor of claim 1, wherein the replaceable component comprises the one or more pins, a guide plate of the contactor, or one or more elastomer elements of the contactor.

5. The contactor of claim 1, wherein the IC is to determine a temperature of the contactor.

6. The contactor of claim 5, wherein the IC includes a diode, and wherein the IC utilizes the diode to determine the temperature of the contactor.

7. The contactor of claim 1, wherein the IC is embedded within the body.

8. The contactor of claim 1, wherein the body includes a main body and a fixed alignment frame, and wherein the IC is located between the main body and the fixed alignment frame.

9. The contactor of claim 1, wherein the product is an integrated circuit package or an integrated circuit wafer.

10. The contactor of claim 1, wherein the IC is a memory device.

11. A test fixture for testing a product, the test fixture comprising:
a test arrangement that includes a contactor, wherein the contactor includes:
a body to receive the product; and
an integrated circuit (IC) located in the body, wherein the IC includes memory for storing information related to the contactor, including an indication of a number of uses since a replaceable component has been replaced; and a test system communicatively coupled to the IC, wherein the test system is to retrieve at a least a portion of the information related to the contactor from the memory, including the indication of the number of uses since the replaceable component had been replaced.

12. The test fixture of claim 11, wherein the memory is to store an identifier of the contactor, and wherein the test system is to retrieve the identifier of the contactor from the memory.

13. The test fixture of claim 11, wherein the test system is to indicate that the replaceable component is to be replaced if the number of uses since the replaceable component had been replaced exceeds a predetermined value.

14. The test fixture of claim 11, wherein the test arrangement further includes an interface board located on a first side of the body, wherein the body receives the product on a second side of the body, and wherein the contactor includes one or more pins that provide an interface between the product and the interface board when the product has been received.

15. The test fixture of claim 11, wherein the IC includes a diode, wherein the IC is to utilize the diode to determine a temperature of the contactor, and wherein the test system is to retrieve the temperature of the contactor from the IC.

16. The test fixture of claim 11, wherein the IC is a memory device, and wherein the IC is embedded within the body.

17. A method of determining information related to a contactor utilized for testing of products by a test system, comprising:

retrieving, by the test system, an identifier of the contactor from a memory of an integrated circuit (IC) located within the contactor;

retrieving, by the test system, an indication of a number of uses of the contractor since a replaceable component had been replaced from the memory; and determining, by the test system, an identity of the contactor based on the identifier retrieved from the memory.

18. The method of claim 17, further comprising:

comparing, by the test system, the number of uses to a threshold number of uses of the contactor corresponding to the replaceable component; and determining, by the test system, whether the replaceable component is to be replaced based on the comparison of the number of uses with the threshold number of uses.

19. The method of claim 17, further comprising:

retrieving, by the test system, an indication of a temperature of the contactor from the IC, wherein the IC determined the temperature via a diode of the IC;

comparing, by the test system, the temperature of the contactor with a temperature of a product under test indicated to the test system by the product under test; and determining, by the test system, a validity of the temperature of the product under test based on the comparison of the temperature of the contactor with the temperature of the product under test.

20. The test fixture of claim 11, wherein the replaceable component comprises one or more pins of the contactor, a guide plate of the contactor, or one or more elastomer elements of the contactor.

* * * * *